United States Patent
Hashiguchi et al.

(10) Patent No.: US 7,060,115 B2
(45) Date of Patent: Jun. 13, 2006

(54) SUBSTRATE PROCESSING METHOD, SUBSTRATE PROCESSING APPARATUS AND SUBSTRATE CARRYING METHOD

(75) Inventors: Hiroharu Hashiguchi, Kumamoto (JP); Kouji Okamura, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 194 days.

(21) Appl. No.: 10/230,067

(22) Filed: Aug. 29, 2002

(65) Prior Publication Data

US 2003/0003774 A1 Jan. 2, 2003

Related U.S. Application Data

(62) Division of application No. 09/906,695, filed on Jul. 18, 2001, now Pat. No. 6,461,986.

(30) Foreign Application Priority Data

| Jul. 24, 2000 | (JP) | ........................... | 2000-222228 |
| Aug. 9, 2000 | (JP) | ........................... | 2000-241146 |

(51) Int. Cl.
*H01G 9/00* (2006.01)

(52) U.S. Cl. ........................... 29/25.03; 118/301
(58) Field of Classification Search ............... 29/25.03, 29/25.01; 118/300, 301
See application file for complete search history.

(56) References Cited

U.S. PATENT DOCUMENTS

| 5,788,868 | A | 8/1998 | Itaba et al. ............. 156/345.32 |
| 5,849,602 | A | 12/1998 | Okamura et al. | |
| 2003/0199174 | A1 * | 10/2003 | Moriyama ................. 438/758 |

FOREIGN PATENT DOCUMENTS

| JP | 02-82026 U | 6/1990 |
| JP | 07-142356 A1 | 6/1995 |
| JP | 7-176588 | 7/1995 |
| JP | 9-252035 | 9/1997 |
| JP | 10-145052 | 5/1999 |
| JP | 11-145052 | 5/1999 |
| JP | 2000-156398 | 6/2000 |

OTHER PUBLICATIONS

Int'l "Sematech Advanced Process Control Framework Initatve (APCF) Project: Overview" Technology Transfer#99053735A–TR. <<http://www.sematech.org/docubase/document/373atr.pdf>>Jun. 30, 2004.*
Yoshioka, K. JPAB Publication No. JP410335418A "Treating Appartus" Dec. 18, 1998 (abstract only).*

* cited by examiner

*Primary Examiner*—Laura M. Schillinger
*Assistant Examiner*—Heather A. Doty
(74) *Attorney, Agent, or Firm*—Oblon, Spivak, McClelland, Maier & Neustadt, P.C.

(57) ABSTRACT

The present invention is a method of performing processing for a substrate including the step of carrying the substrate, which has been pre-treated, to a heat treatment unit for heating the substrate, prior to supplying a treatment solution to the substrate to perform solution treatment, in which the carrying is performed such as to fix a period after the pretreatment for the substrate is completed and before it is carried to the heat treatment unit. According to the present invention, for example, in a lithography process, the substrate is carried such as to fix the period after exposure processing that is the pretreatment and before the substrate is carried to the heat treatment unit where heat treatment that is the following treatment is performed, whereby the degrees of chemical reaction of coating films by the exposure processing become uniform between the substrates.

10 Claims, 13 Drawing Sheets

SUBSTRATE PROCESSING METHOD, SUBSTRATE PROCESSING APPARATUS AND SUBSTRATE CARRYING METHOD

This application is a divisional of patent application Ser. No. 09/906,695 filed Jul. 18, 2001. Now U.S. Pat. No. 6,461,986.

BACKGROUND OF THE INVENTION

1. Field of the Invention

The present invention relates to a substrate processing method, a substrate processing apparatus and a substrate carrying method.

2. Description of the Related Art

In a photolithography process in fabrication processes for the semiconductor device, for example, resist coating treatment for forming a resist film on a wafer surface, exposure processing in which a pattern is irradiated on the wafer and exposed, post-exposure baking treatment for heating the wafer after the exposure processing, developing treatment for performing development for the heat-treated wafer and the like are performed in sequence. These processing and treatments are sequentially performed in processing and treatment units separately provided in a single coating and developing treatment system and an aligner adjacent to the system. The coating and developing treatment system is structured to process a plurality of wafers concurrently at the same time, in which normally one carrier carries the wafers between the above-mentioned processing and treatment units.

The carrier is configured to freely access the plurality of processing and treatment units and its operation is controlled to carry the wafers in the processing and treatment units at preferable timing in accordance with the processing steps to the processing and treatment units in which the respective following steps are performed, so that a series of the photolithography processing steps is smoothly performed.

However, one carrier carries a number of wafers as described above, and thus in the case where, for example, when the carrier is carrying one wafer in one processing or treatment unit, treatment for another wafer is completed in another processing or treatment unit, the carrier can not carry the other wafer before it finishes carrying the one wafer. Meanwhile, when the carrier is not carrying a wafer but in a waiting state, the carrier can immediately carry the other wafer. Accordingly, the period required after the treatment for a wafer finishes and before the carrier goes to receive the wafer depends on the position and the state of the carrier, presenting a fear that the total periods required from the end of one treatment to the start of the following treatment become nonuniform between the wafers.

When a so-called chemically amplified resist is used as a resist solution for forming the aforementioned resist film, exposure generates acid, and the resist film reacts with the acid and the resist film in the exposed portion changes to be soluble in the developing solution. Therefore, the degree of the developing treatment, that is, the line width of the circuit pattern on the wafer, greatly depends on progress of the chemical reaction by the acid, and the chemical reaction is greatly affected by the period from the exposure to the development.

Accordingly, the period after the wafer is subjected to the exposure processing and before the developing treatment, especially, the period required from the exposure processing to the post-exposure baking treatment is affected by the position and the state of the carrier to be nonuniform, presenting a fear of adversely affecting the line of the circuit pattern which is finally formed on the wafer.

Further, the aforementioned carrying of the wafer is conducted as follows, normally a main controller for controlling the carrier receives a processing end signal from each processing or treatment unit and stores it, the carrier recognizes the stored processing end signal every completion of the carrying of one wafer, and the carrier verifies it and then moves to the processing or treatment unit that is the sender to carry the wafer for which predetermined processing has been completed in the processing or treatment unit to the processing or treatment unit where the following step is performed.

According to the above-described control mechanism for the carrier, however, since the carrier finishes the carrying of the present wafer and verifies processing end signal in the main controller, and then moves to the processing or treatment unit that is the sender, the period after the processing or treatment for the wafer finishes in the processing or treatment unit and before the carrier goes to the processing or treatment unit to receive the wafer differs depending on the state of the carrier at the moment or the number of the processing end signals, and generally tends to be longer. Therefore, it is impossible to carry the wafer between the processing and treatment units speedily and in a fixed period.

Especially when the chemically amplified resist solution is used as described above, a treatment is performed in which the acid, as a catalyst, generated in the resist film by the exposure is increased in temperature to activate, promoting the chemical reaction for making the resist film soluble in the developing solution in the post-exposure baking treatment. In the following cooling treatment, a treatment of decreasing the acid in temperature to stop the catalysis of the acid is performed. Therefore, unless the wafer is speedily carried between the post-exposure baking unit and the cooling treatment unit, the wafer is overbaked to cause the chemical reaction to excessively proceed by the catalysis of the acid to widen the width of the resist film soluble in the developing solution, resulting in too wide line width of the circuit pattern which is finally formed on the wafer. Furthermore, if the wafer is not carried between the post-exposure baking unit and the cooling treatment unit in a fixed manner, there is a fear that line widths of the circuit patterns formed on wafers will become nonuniform between the wafers.

SUMMARY OF THE INVENTION

The present invention is made in view of the above-described points, and its object is to fix the period required, for example, from exposure processing to post-exposure baking treatment, that is, to heat treatment before developing treatment in a photolithography process, or to make an improvement to make the period close to fixed.

Further, a second object of the present invention is to shorten the period after the completion of heat treatment and before the substrate is cooled and to fix the period.

The present invention is a method of performing processing for a substrate including the step of carrying the substrate, which has been pre-treated, to a heat treatment unit for heating the substrate, prior to supplying a treatment solution to the substrate to perform solution treatment, wherein the carrying is performed such as to fix a period after the pretreatment for the substrate is completed and before the substrate is carried to the heat treatment unit.

According to another aspect, the present invention is a method of performing processing for a substrate including the step of carrying the substrate, which has been exposure-processed, to a heat treatment unit where heat treatment before developing treatment is performed, wherein the carrying is performed such as to fix a period after the exposure processing for the substrate is completed and before the substrate is carried to the heat treatment unit.

According to still another aspect, the present invention is a method of performing processing for a substrate including the steps of carrying the substrate, which has been exposure-processed, temporarily to a delivery unit by a first carrier, and thereafter carrying the substrate staying in the delivery unit to a heat treatment unit where heat treatment before developing treatment is performed, by a second carrier, wherein at least when the exposure for the substrate is completed, the first carrier is waiting at a first position where the first carrier is capable of receiving the exposed substrate to immediately carry the substrate, for which the exposure has been completed, to the delivery unit, and wherein at least when the exposed substrate is carried to the delivery unit, the second carrier is waiting at a second position where the second carrier is capable of receiving the substrate staying in the delivery unit to carry the substrate to the heat treatment unit immediately after the exposed substrate is carried to the delivery unit.

According to yet another aspect, the present invention is a method of performing processing for a substrate including the steps of carrying the substrate, which has been exposure-processed, temporarily to a delivery unit by a first carrier, and thereafter carrying the substrate staying in the delivery unit to a heat treatment unit where heat treatment before developing treatment is performed, by a second carrier, wherein at least when the exposure processing for the substrate is completed, the first carrier is waiting at a predetermined position where the first carrier is capable of receiving the substrate to carry the substrate to the delivery unit immediately after the exposure processing for the substrate is completed.

According to further another aspect, the present invention is a method of performing processing for a substrate including the steps of carrying the substrate, which has been exposure-processed, temporarily to a delivery unit by a first carrier, and thereafter carrying the substrate staying in the delivery unit to a heat treatment unit where heat treatment before developing treatment is performed, by a second carrier, wherein at least when the substrate is carried to the delivery unit, the second carrier is waiting at a predetermined position where the second carrier is capable of receiving the substrate to carry the substrate to the heat treatment unit immediately after the substrate is carried to the delivery unit.

The apparatus of the present invention is a substrate processing apparatus for performing processing for a substrate including a carrier for carrying the substrate, which has been pre-treated, to a heat treatment unit for heating the substrate prior to solution treatment performed by supplying a treatment solution to the substrate, and a controller for controlling the carrier such as to fix a period after the pretreatment for the substrate is completed and before the substrate is carried to the heat treatment unit.

According to another aspect, the present invention is a substrate processing apparatus for performing processing for a substrate including a carrier for carrying the substrate, which has been exposure-processed, to a heat treatment unit where heat treatment before developing treatment is performed, and a controller for controlling the carrier such as to fix a period after the exposure processing for the substrate is completed and before the substrate is carried to the heat treatment unit.

According to still another aspect, the present invention is a substrate processing apparatus for performing processing for a substrate including a first carrier for carrying the substrate, which has been exposure-processed, to a delivery unit, a second carrier for carrying the substrate staying in the delivery unit to a heat treatment unit where heat treatment before developing treatment is performed, and a controller for controlling the first carrier and the second carrier, wherein the controller conducts a control so that at least when the exposure processing for the substrate is completed, the first carrier is waiting at a first position where the first carrier is capable of receiving the exposed substrate to immediately carry the substrate, for which the exposure processing has been completed, to the delivery unit, and further at least when the exposure-processed substrate is carried to the delivery unit, the second carrier is waiting at a second position where the second carrier is capable of receiving the substrate staying in the delivery unit to carry the substrate to the heat treatment unit immediately after the exposure-processed substrate is carried to the delivery unit.

According to yet another aspect, the present invention is a substrate processing apparatus for performing processing for a substrate including a first carrier for carrying the substrate, which has been exposure-processed, to a delivery unit, a second carrier for carrying the substrate staying in the delivery unit to a heat treatment unit where heat treatment before developing treatment is performed, and a controller for controlling the first carrier and the second carrier, wherein the controller conducts a control so that at least when the exposure processing for the substrate is completed, the first carrier is waiting at a predetermined position where the first carrier is capable of receiving the substrate to carry the substrate to the delivery unit immediately after the exposure processing for the substrate is completed.

According to further another aspect, the present invention is a substrate processing apparatus for performing processing for a substrate including a first carrier for carrying the substrate, which has been exposure-processed, to a delivery unit, a second carrier for carrying the substrate staying in the delivery unit to a heat treatment unit where heat treatment before developing treatment is performed, and a controller for controlling the first carrier and the second carrier, wherein the controller conducts a control so that at least when the substrate is carried to the delivery unit, the second carrier is waiting at a predetermined position where the second carrier is capable of receiving the substrate to carry the substrate to the heat treatment unit immediately after the substrate is carried to the delivery unit.

Furthermore, in order to attain the second object, according to the present invention, in a substrate carrying method of carrying a substrate, which has been heat-treated in a heat treatment unit, by a carrier to a cooling treatment unit where cooling treatment for the substrate is performed, at least when the heat treatment for the substrate is completed, the carrier is waiting at a predetermined position where the carrier is capable of receiving the substrate in the heat treatment unit.

The present invention includes the step of carrying the substrate, which has been pre-treated, to a heat treatment unit for heating the substrate, prior to supplying a treatment solution to the substrate to perform solution treatment, wherein the carrying is performed such as to fix a period after the pretreatment for the substrate is completed and before the substrate is carried to the heat treatment unit.

According to the present invention, since the carrying of the substrate is performed such as to fix the period after the pretreatment for the substrate is completed and before it is carried to the heat treatment unit, for example, the substrate is carried such as to fix the period after the exposure processing that is the pretreatment and before it is carried to the heat treatment unit where heat treatment that is the following treatment, whereby the degrees of the chemical reaction of the coating films by the above-described exposure processing become uniform between substrates. Thus, the developing treatment is performed for the substrates at the same degree, uniformly forming the line widths of the circuit patterns which are finally formed on the substrates between substrates.

For example, the carrying such as to fix the period after the completion of the exposure processing for the substrate and before it is carried to the heat treatment unit is realized, for example, by controlling the operation of the carrier for carrying the substrate from the aligner to the heat treatment unit. More specifically, it is suggested that, for example, the carrier is kept waiting in front of the aligner in advance to carry the substrate to the heat treatment unit immediately after the exposure is completed and the substrate comes out of the aligner, the carrying of the substrate is always started after a lapse of a fixed period from the completion of the exposure processing, the carrier holding the substrate is suspended at a predetermined place and the suspension period in the event is adjusted, or the like.

Furthermore, according to the present invention, when the exposure processing for the substrate is completed, the first carrier is waiting at the first position where it can receive the substrate to carry the substrate to the delivery unit immediately after the completion of exposure for the substrate. Furthermore, when the substrate is carried to the delivery unit, the second carrier is waiting at the second position where it can receive the substrate to carry the substrate to the heat treatment unit immediately after the substrate is carried to the delivery unit. The first and second carriers wait at the respective predetermined positions preceding to the carrying of other substrates, eliminating the fact that the carriers are, for example, carrying the other substrates or have moved to the positions where they can not immediately receive the substrate, with the result that the carrying period for the substrate from the exposure processing to the heat treatment unit is kept fixed. Accordingly, the above-described chemical reaction of the solubilization in the developing solution uniformly proceeds, whereby the developing treatment is uniformly performed for the substrates, reducing nonuniformity in line width of the finally formed pattern between the substrates. It should be noted that the first carrier and the second carrier are preferably waiting at the respective predetermined positions at least when the exposure is completed and at least when the substrate is carried to the delivery unit respectively, and they may be previously waiting from a predetermined period before.

According to the present invention, the carrier is kept waiting from before the completion of the heat treatment at the predetermined position where it can receive the substrate in the heat treatment unit to receive the substrate immediately after the completion of the heat treatment and carry it to the cooling treatment unit. This shortens the period after the completion of the heat treatment and before the substrate is subjected to the cooling treatment and keeps the period fixed. Therefore, overbaking in the heat treatment and non-uniformity in pattern which is finally formed on the substrate between substrates are reduced.

The heat treatment unit gives notice of completion of the heat treatment to the carrier controller, and the carrier controller moves the carrier to the waiting position based on the notice, whereby the carrier can recognize at an earlier time that the heat treatment is immediately before completion, and move to the predetermined position before the completion of the heat treatment and wait there. Therefore, when the heat treatment is completed, the carrier can be waiting at the position where it can access the heat treatment unit and immediately carry the substrate, for which the heating has been completed, to the cooling treatment unit.

By giving discrimination marks to the substrates, when the carrier can not be waiting at the predetermined position at the completion of the heat treatment of the substrate, for example, when the carrier can not be waiting by the completion of the heat treatment because the carrier delays in moving to the predetermined position because of the carrying of another substrate, the substrate, which is presumed to be subjected to the heat treatment at the moment and made stand in a state of a high temperature for a period longer than the other substrates, can be recognized as a substrate needing caution based on its discrimination mark. This makes it possible to recognize the substrate of high possibility of being overbaked and remove the substrate needing caution from the other substrates when necessary. Note that the discrimination mark given to the substrate is not limited to one actually provided on the substrate, but it may be an imaginary discrimination mark, for example, a code which is recognized by a controller or the like to result in discrimination of each substrate.

DETAILED DESCRIPTION OF THE PREFERRED EMBODIMENT

Figure 1:
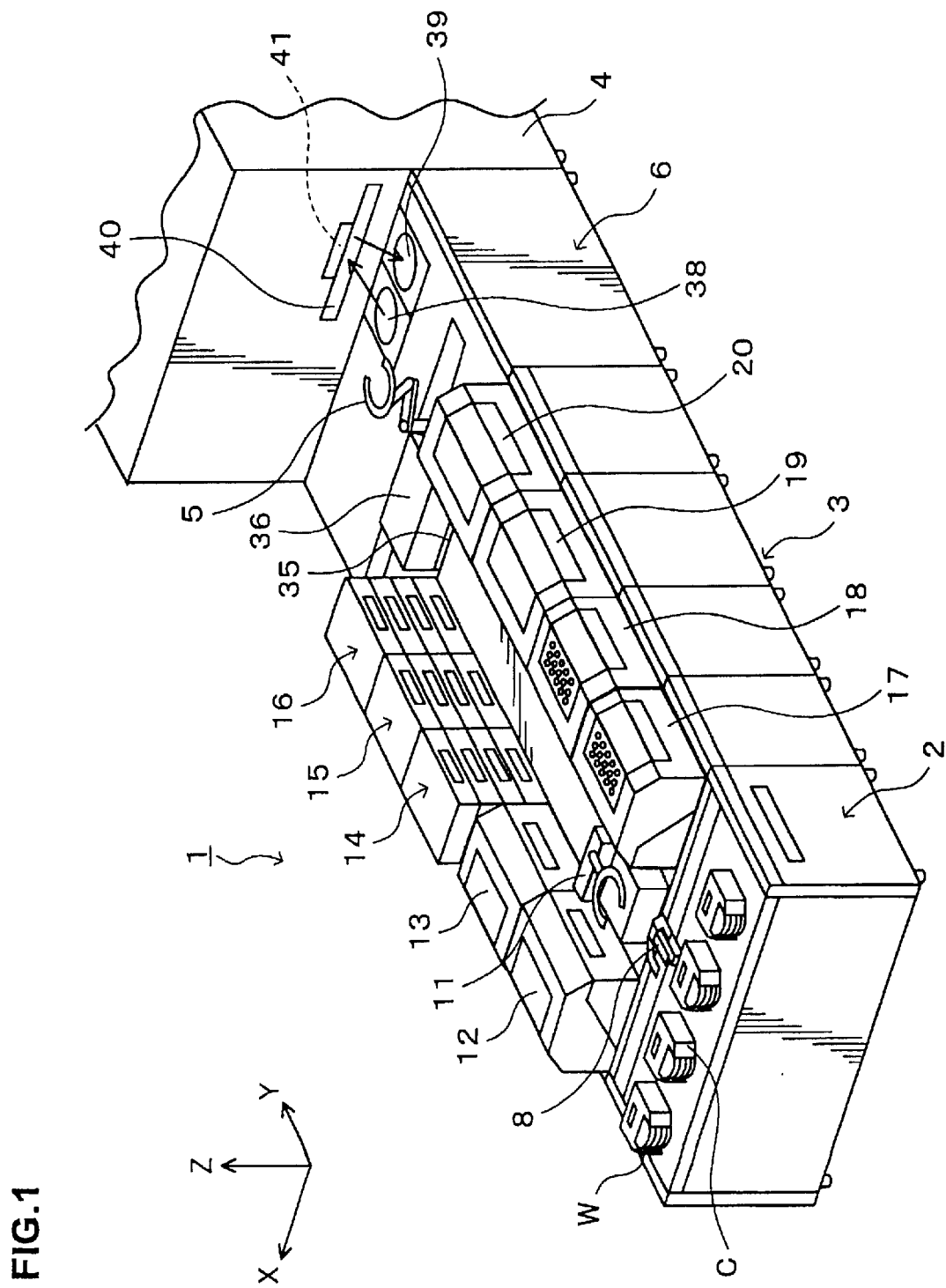
FIG. 1 is a perspective view showing the appearance of a coating and developing treatment system in which a coating and developing treatment method according to this embodiment is carried out.

Hereinafter, preferred embodiments of the present invention are described. FIG. 1 is a perspective view of a coating and developing treatment system 1 as a coating and developing treatment apparatus in which a coating and developing treatment method of the present invention is carried out, and FIG. 2 is a plane view roughly showing the coating and developing treatment system.

Figure 2:
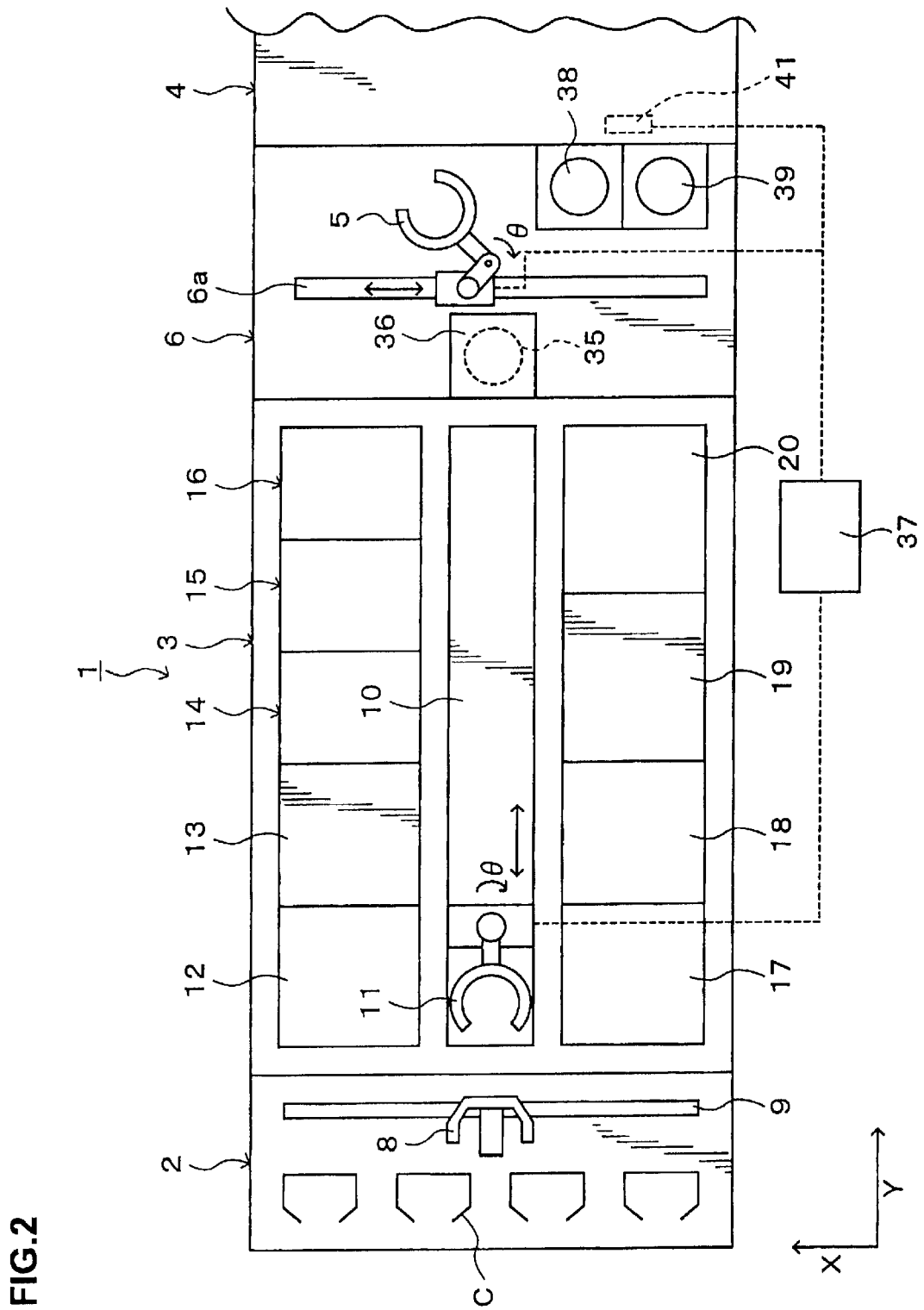
FIG. 2 is a plane view roughly showing the coating and developing treatment system in FIG. 1.

As shown in FIG. 1 and FIG. 2, the coating and developing treatment system 1 has a configuration in which a cassette station 2 for carrying, for example, a plurality of wafers W in a cassette, as a unit, from/to the outside into/out of the coating and developing treatment system 1 and carrying the wafer W into/out of a cassette C, a processing station 3 in which various kinds of processing and treatment units each for performing predetermined processing or treatment for the wafers W one by one in coating and developing treatment steps are arranged side by side in two rows in a Y-direction, and an interface section 6 which is provided adjacent to the processing station 3 and includes a carrier 5 as a first carrier unit for carrying the wafer W between the processing station 3 and an aligner 4 provided outside the coating and developing treatment system 1, are integrally connected.

In the cassette station 2, a plurality of cassettes C can be mounted in a line in an X-direction. A wafer carrier 8 transportable in the direction of arrangement of the cassettes (the X-direction) and in the direction of arrangement of the wafers W housed in the cassette C (a Z-direction; a vertical direction) is provided to freely move along a carrier guide 9 to be able to selectively access each cassette C.

In the processing station 3, a carrier rail 10 extending in the Y-direction is provided at the center, and a main carrier unit 11 is provided as a second carrier unit movable on the carrier rail 10. Across the carrier rail 10, various kinds of processing and treatment units are arranged on both sides in the Y-direction. More specifically, a brush scrubber 12 for cleaning the wafer W taken out of the cassette C, a wet cleaner 13 for performing high pressure jet cleaning for the wafer W, and treatment unit groups 14, 15 and 16 in each of which a plurality of thermal treatment units each for performing predetermined thermal treatment for the wafer W are multi-tiered, are arranged side by side, in order from the cassette station 2 side, on the front side of the carrier rail 10 in the X-direction. Meanwhile, resist coating units 17 and 18 each for applying a resist solution to the wafer W and developing treatment units 19 and 20 each for performing developing treatment for the exposure-processed wafer W are arranged side by side, in order from the cassette station 2 side, on the rear side of the carrier rail 10 in the X-direction.

Figure 3:
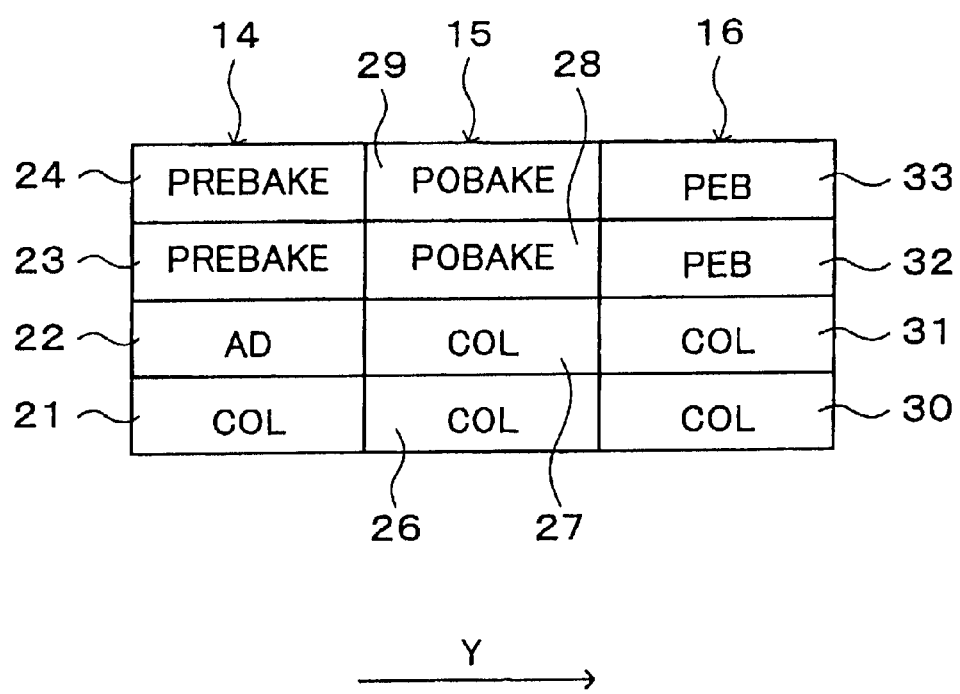
FIG. 3 is an explanatory view showing an arrangement example of processing and treatment units in processing unit groups of the coating and developing treatment system.

In the processing unit group 14, as shown in FIG. 3, for example, a cooling unit 21 for performing cooling treatment for the wafer W, an adhesion unit 22 for enhancing adhesion of the resist solution to the wafer W, pre-baking units 23 and 24 each for evaporating a solvent in the resist solution are tiered in order from the bottom. In the processing unit group 15, cooling units 26 and 27 and post-baking units 28 and 29 each for performing heat treatment for the developing-treated wafer W tiered in order from the bottom.

In the processing unit group 16, cooling units 30 and 31 and post-exposure baking units (hereinafter, referred to as "PEB units") 32 and 33 as heat treatment units each for performing heat treatment for the wafer W after exposure processing and before developing treatment, are tiered in order from the bottom.

The main carrier unit 11 is configured to be movable in a direction of rotation (a θ-direction) and in the Z-direction, as shown in FIG. 1 and FIG. 2, in addition to the above-described Y-direction so as to access and carry the wafer W to the processing and treatment units in the processing station 3, the wafer carrier 8 in the cassette station 2, and extension units 35 and 36 as delivery units in the interface section 6.

Figure 4:
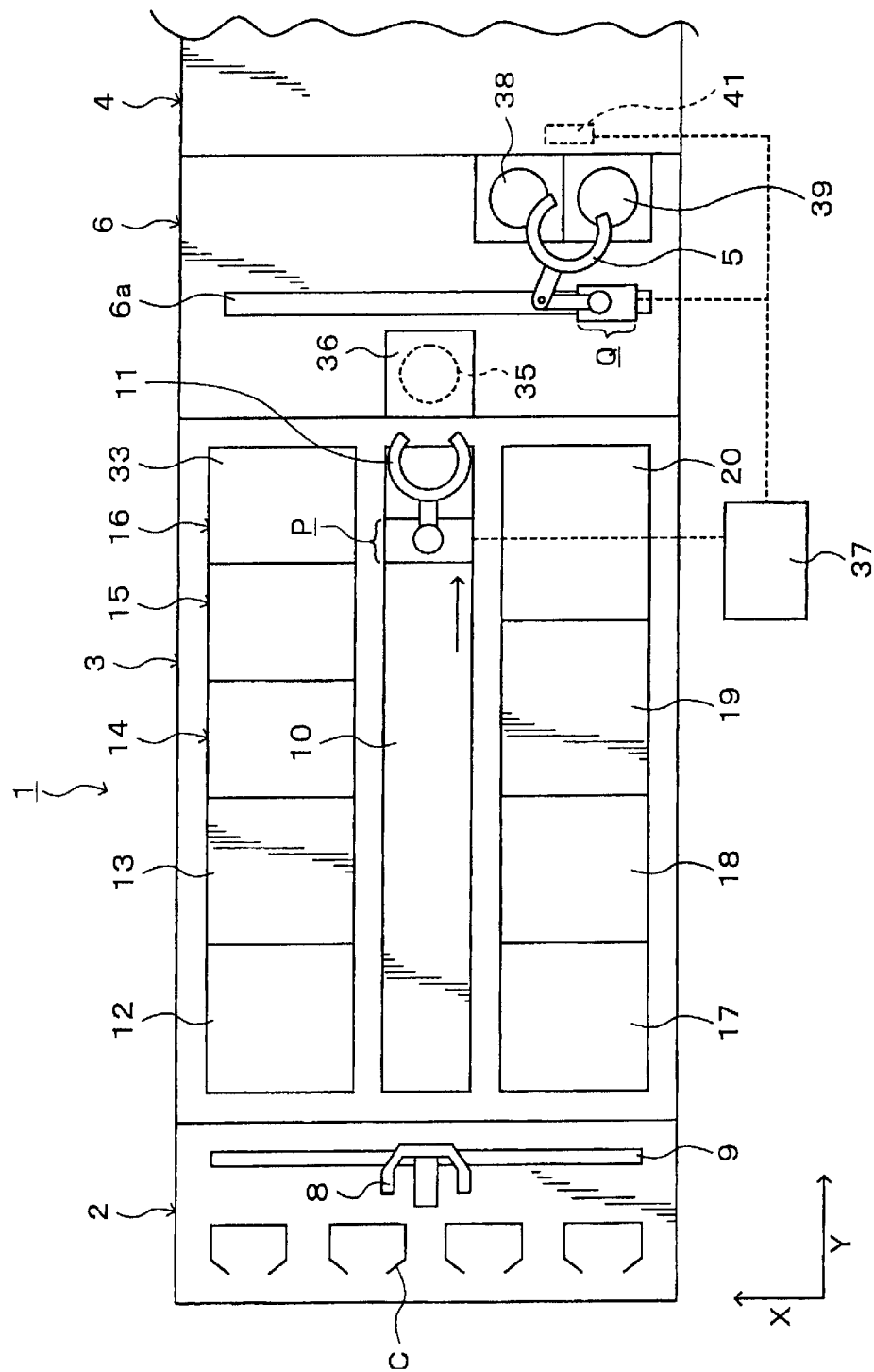
FIG. 4 is a state view of the coating and developing treatment system showing a state in which a main carrier unit and a carrier are waiting.

The main carrier unit 11 is controlled by a main controller 37 having a carrying algorithm as a program. More specifically, the main carrier unit 11 is controlled to carry in sequence each wafer W under processing in the processing station 3 to a processing unit where the following processing is performed in accordance with a predetermined processing flow for the wafer W. The main controller 37 controls the main carrier unit 11 so that when the wafer W for which at least exposure processing has been finished is carried to the above-described extension unit 36, the main carrier unit 11 is waiting at a waiting position P, as shown in FIG. 4, as a second position where the main carrier unit 11 can access the extension unit 36, that is a position where the main carrier unit 11 approaches closest to the extension unit 36 on the carrier rail 10.

The main controller 37 is provided with a timer function for counting a maximum waiting period M, which is a maximum period during which the main carrier unit 11 is waiting at the waiting position P. This timer function is for releasing the waiting by the main carrier unit 11 when some trouble occurs in the aligner 4 and thus the wafer W is not sent out of the aligner 4.

The timer function is configured to start counting when the wafer W is carried into the aligner 4 and stop the counting when the wafer W is carried out of the aligner 4. Accordingly, the main carrier unit 11 is configured to be usually waiting at the waiting position P until it receives at the extension unit 36 the wafer W from the aligner 4, but if the wafer W is not sent out of the aligner 4 by the time when the maximum waiting period M which the timer function counts elapses, the waiting by the main carrier unit 11 is released.

Figure 5:
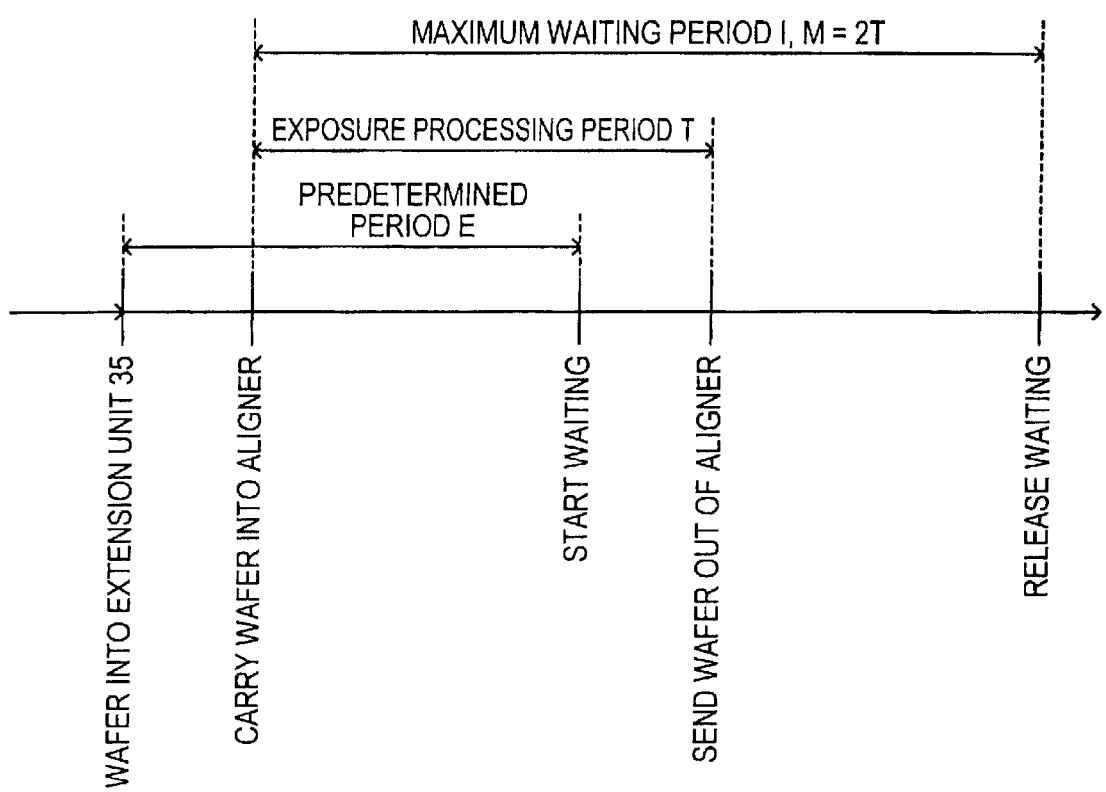
FIG. 5 is an explanatory view showing the relation between exposure processing period and maximum waiting period.

As shown in FIG. 5, when it is assumed that a period usually required for an exposure processing step after the wafer W is carried into the aligner 4 until it is carried out of the aligner 4 is an exposure processing period T as a predetermined period T, the maximum waiting period M is previously set to be, for example, M=2T, which is sufficiently longer than the exposure processing period T.

As shown in FIG. 1 and FIG. 2, the extension units 35 and 36 each for delivering the wafer W between the main carrier unit 11 and the carrier 5 are arranged tiered in order from the bottom on the processing station 3 side of the interface section 6 and on the extension line of the carrier rail 10. Each of the extension units 35 and 36 includes a mounting table (not shown) for mounting the wafer W thereon and raising and lowering pins (not shown) for raising and lowering the wafer W The extension unit 35 is used when the wafer W is carried from the main carrier unit 11 to the carrier 5 side, and the extension unit 36 is used when the wafer W is carried from the carrier 5 to the main carrier unit 11 side. On the aligner 4 side of the interface section 6, a carrying-in mounting table 38 on which the wafer W is temporarily mounted when the wafer W is carried into the aligner 4, and a carrying-out mounting table 39 on which the wafer W is mounted when the wafer W is carried out of the aligner 4, are arranged side by side in the X-direction.

At the center of the interface section 6, a rail 6a extending in the X-direction is provided, on which the above-described carrier 5 is provided to freely move. The carrier 5 is configured to freely move in the X-direction, the Z-direction, and freely rotate in the θ-direction (a direction of rotation around the Z-axis) so as to access the extension units 35 and 36, the carrying-in mounting table 38 and the carrying-out mounting table 39 and carry the wafer W to them. The carrier 5 is controlled by the main controller 37 similarly to the main carrier unit 11 so that at least when the wafer W, for which exposure processing has been completed, is mounted on the carrying-out mounting table 39, the carrier 5 is waiting at a waiting position Q, as shown in FIG. 4, as a first position where the carrier 5 can receive the wafer W on the carrying-out mounting table 39.

The timer function of the main controller 37 is used also for the carrier 5, so that the carrier 5 is configured to wait at the waiting position Q until a period not longer than a maximum waiting period I elapses, but if the wafer W is not sent out of the aligner 4 by the time the maximum waiting period I elapses, the waiting by the carrier 5 is released. The main controller 37 also controls the carrier 5 as a carrier unit.

In this embodiment, the maximum waiting period I of the carrier 5 is set at the same value as the maximum waiting period M of the main carrier unit 11 as shown in FIG. 5. Sometimes the exposure processing is not performed in the period as usual because of alignment operation or the like in the aligner 4, and thus the maximum waiting period I is preferably set at the longest period possible keeping in a consideration nonuniformity in period of the exposure processing step.

The aligner 4 is provided adjacent to the interface section 5 as shown in FIG. 1. The aligner 4 is provided with a carrier opening 40 through which the wafer W passes when carried into/out of the aligner 4. In the aligner 4, a carrier means not shown is provided to carry in the wafer W from the aforesaid carrying-in mounting table 38 and carry out the wafer W to the aforesaid carrying-out mounting table 39. The carrier opening 40 is provided with a sensor 41 for detecting the wafer W being carried into/out of the aligner 4 and sending the signal to the main controller 37, so that with the signal as a trigger the counting of the timer function in the main controller 37 is started or stopped.

Next, the coating and developing treatment method which is carried out in the coating and developing treatment system 1 structured as described above is explained along the process of the photolithography processing steps.

Initially, in the cassette station 2, the wafer carrier 8 takes one unprocessed wafer W out of the cassette C, and then the main carrier unit 11 receives the wafer W direct from the wafer carrier 8. Subsequently, the main carrier unit 11 carries the wafer W in sequence to the brush scrubber 12 and the wet cleaner 13, where the wafer W is subjected to predetermined cleaning treatment.

Thereafter, the wafer W is carried again by the main carrier unit 11 to the adhesion unit 22 included in the processing unit group 14 and coated with an adhesion promoter such as HMDS for enhancing adhesion to the resist solution. Then, the wafer W is carried in sequence by the main carrier unit 11 to the cooling unit 21, the resist coating unit 17 or 18, the pre-baking unit 23 or 24, and the cooling unit 26 or 27 to be subjected to predetermined processing.

The wafer W which has been cooled to a predetermined temperature in the cooling unit 26 or 27 is carried by the main carrier unit 11 into the extension unit 35 and mounted on a mounting table not shown.

Then, the wafer W is carried by the carrier 5 to the carrying-in mounting table 38 near the aligner 4, while the main carrier unit 11 carries other wafers in the treatment units in the processing station 3 to the treatment units where the respective next steps are performed while moving on the carrier rail 10 in accordance with the carrying program of the main controller 37 during a predetermined period E. The predetermined period E here is a period during which the main carrier unit 11 may carry the other wafers, that is, a predetermined set period shorter than a period which is usually required after the wafer W is mounted on the extension unit 35 and before the wafer W is sent out of the aligner 4 as shown in FIG. 5.

After the predetermined period E elapses, the main carrier unit 11 moves to the waiting position P where it is accessible to the extension unit 36, and waits there until the wafer W which has been carried into the aligner 4 is returned to the extension unit 36. It should be noted that the predetermined period E is set, for example, to be the same period as the exposure processing period T so that the main carrier unit 11 is waiting without fail at the waiting position P when the wafer W for which exposure processing is finished and mounted on the extension unit 36.

Figure 6:
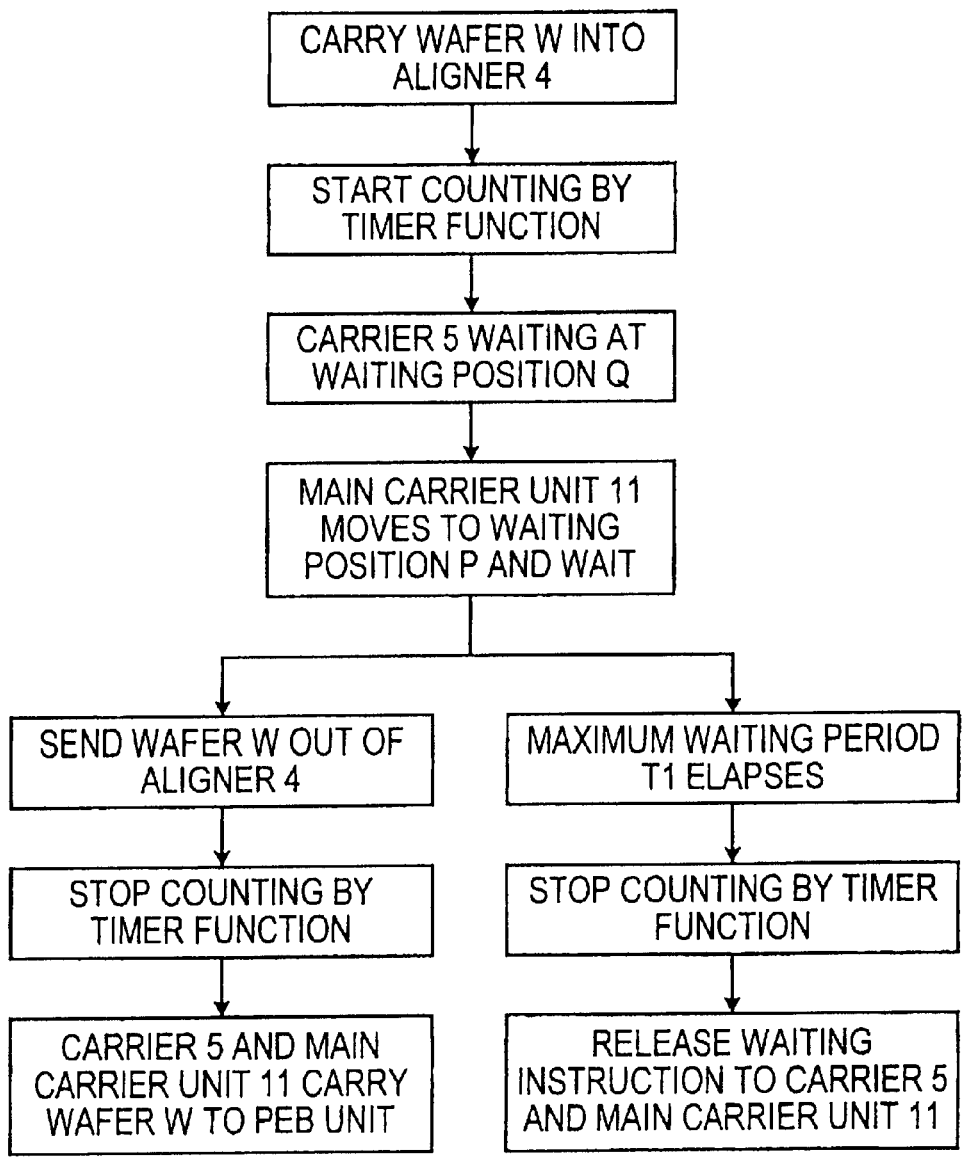
FIG. 6 shows a flowchart of wafer processing in relation to a timer function of the main carrier unit.

The wafer W mounted on the carrying-in mounting table 38 by the carrier 5 is carried through the carrier opening 40 of the aligner 4 into the aligner 4 by the carrier means not shown in the aligner 4. Hereinafter, the processing for the wafer W relating to the timer function is shown in the flowchart in FIG. 6. In this event, the sensor 41 at the carrier opening 40 detects the carrying-in of the wafer W, and sends the signal to the main controller 37. In the main controller 37 which has received the signal, the counting by the aforesaid timer function is started taking the signal as a trigger. The carrier 5 moves to the waiting position Q where it is accessible to the carrying-out mounting table 39, and waits there until exposure processing for the wafer W is completed.

Thereafter, a predetermined pattern is exposed on the wafer W in the aligner 4. While this exposure processing is performed, the aforesaid predetermined period E of the main carrier unit 11 elapses, and the main carrier unit 11 thus moves to the waiting position P and waits there (becomes the state in FIG. 4). Normally, after a lapse of the aforesaid exposure processing period T, the wafer W is sent out from the carrier opening 40 of the aligner 4 and mounted on the carrying-out mounting table 39. In this event, the sensor 41 detects the carrying-out of the wafer W, and sends the signal to the main controller 37, whereby the counting by the timer function of the main controller 37 is stopped and reset.

The wafer W mounted on the carrying-out mounting table 39 is immediately delivered to the carrier 5 waiting at the waiting position Q, and the carrier 5 carries the wafer W to the extension unit 36. The wafer W carried to the extension unit 36 is immediately delivered to the main carrier unit 11 waiting at the waiting position P, and carried to the PEB unit 32 or 33 by the main carrier unit 11.

When some trouble happens in the aligner 4 and the wafer W is not sent out of the aligner 4 even when the maximum waiting period I or M elapses, the timer function is stopped to release the waiting instruction to the carrier 5 and the main carrier unit 11. Then, the carrier 5 stops, for example, its operation, and the main carrier unit 11 carries the other wafers W remaining in the processing station 3, for which exposure processing has been properly performed, along the predetermined processing steps described below and stops its operation after the wafers W are carried out of the processing station 3 to the cassette station 2.

The wafer W which has been properly exposed to light and carried to the PEB unit 32 or 33 is subjected to heat treatment for promoting solubilization reaction of the resist film in the developing solution. Then, the wafer W is immediately carried to the cooling unit 30 or 31 by the main carrier unit 11 and cooled to a predetermined temperature. Subsequently, the wafer W is carried to the developing treatment unit 19 or 20 and subjected to developing treatment.

The wafer W for which the developing treatment has been completed is delivered again to the main carrier unit 11, and carried backward in the Y-direction on the carrier rail 10 by the main carrier unit 11 to be delivered to the wafer carrier 8 in the cassette station 2. The wafer W is returned to the cassette C by the wafer carrier 8, and a series of photolithography processing steps is thus completed.

According to the above-described embodiment, the carrier 5 and the main carrier unit 11 are waiting at the predetermined waiting positions Q and P respectively for the wafer W to come, quickly carrying the wafer W from the exposure processing to the PEB treatment in a fixed period. This equalizes periods required from the exposure processing to the PEB treatment between the wafers W, whereby the solubilization reaction of the resist film to the developing solution uniformly proceeds, and the developing treatment is uniformly performed, resulting in line widths formed on the wafers W uniform between the wafers W.

By providing the timer function in the main controller 37 to set the maximum waiting periods I and M of the carrier 5 and the main carrier unit 11, when the wafer W is not sent out of the exposure processing because of some reason, the carrying by the carrier 5 may be stopped for a check of the aligner 4, and the main carrier unit 11 may carry the other wafers W remaining in the processing station 3, for which exposure has been properly performed, to allow them to be subjected to the end of processing.

In the above-described embodiment, both of the main carrier unit 11 and the carrier 5 are configured to keep waiting, but it is also preferable that when there occurs no nonuniformity between the wafers W in period required before the carrier or carrier unit receives the wafer W by virtue of the structure of the coating and developing treatment system 1 and the carrying algorithm for the carrier or carrier unit, the carrier or carrier unit without nonuniformity is not kept waiting but the other carrier or carrier unit is kept waiting. More specifically, it is preferable to keep only the main carrier unit 11 or only the carrier 5 waiting. Also in this case, it is preferable that the timer function is naturally provided ready for the case in which the exposure processing is not performed in the predetermined period.

The embodiment explained hereinbefore is for the coating and developing treatment method for the wafer W in the photolithography process in the semiconductor wafer device fabrication processes, and the present invention is applicable to a coating and developing treatment method for a substrate other than the semiconductor wafer, for example, an LCD substrate.

According to the present invention, it is possible to fix the period from the completion of the exposure processing for the substrate to the start of the heat treatment before the developing treatment, whereby chemical reaction by the exposure to the coating film proceeds to a fixed degree and thus the wafers W are subjected to the developing treatment to a fixed degree, resulting in uniform line width which is finally formed on the substrate between the substrates.

The carrier and carrier unit previously keep waiting to receive the substrate and immediately carry it, thereby also reducing the period required from the completion of the exposure processing to the performance of the heat treatment before the developing treatment.

The maximum waiting periods of the carrier and carrier unit are provided, thereby making it possible to cope also with the case in which the exposure processing is not properly performed.

Figure 7:
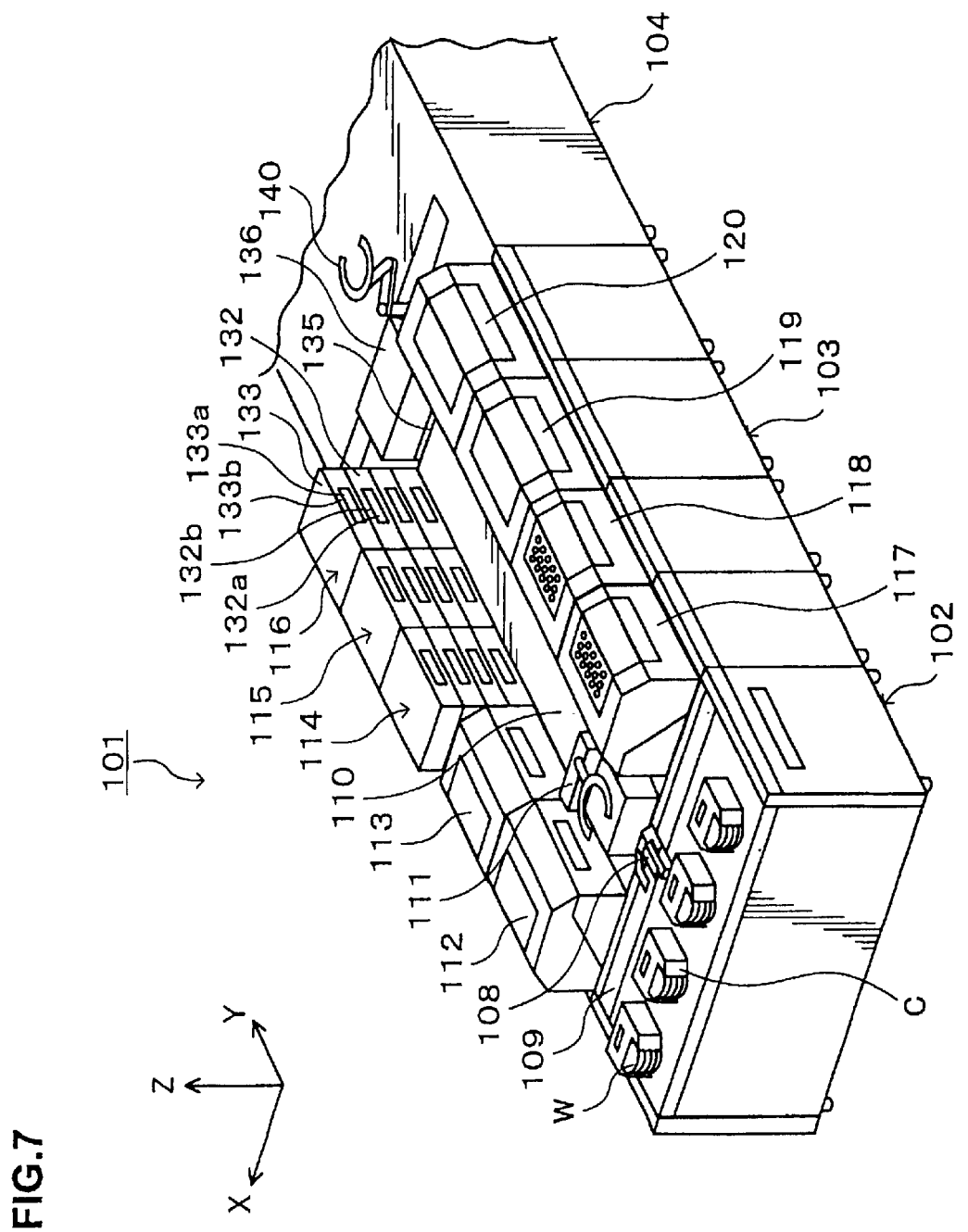
FIG. 7 is a perspective view showing the appearance of a coating and developing treatment system in which a method of carrying the wafer according to a second embodiment of the present invention is carried out.

Next, a second embodiment of the present invention is explained. FIG. 7 is a perspective view of a coating and developing treatment system 101 in which a method of carrying the substrate of the present invention is carried out, and FIG. 8 is a plane view roughly showing the coating and developing treatment system.

Figure 8:
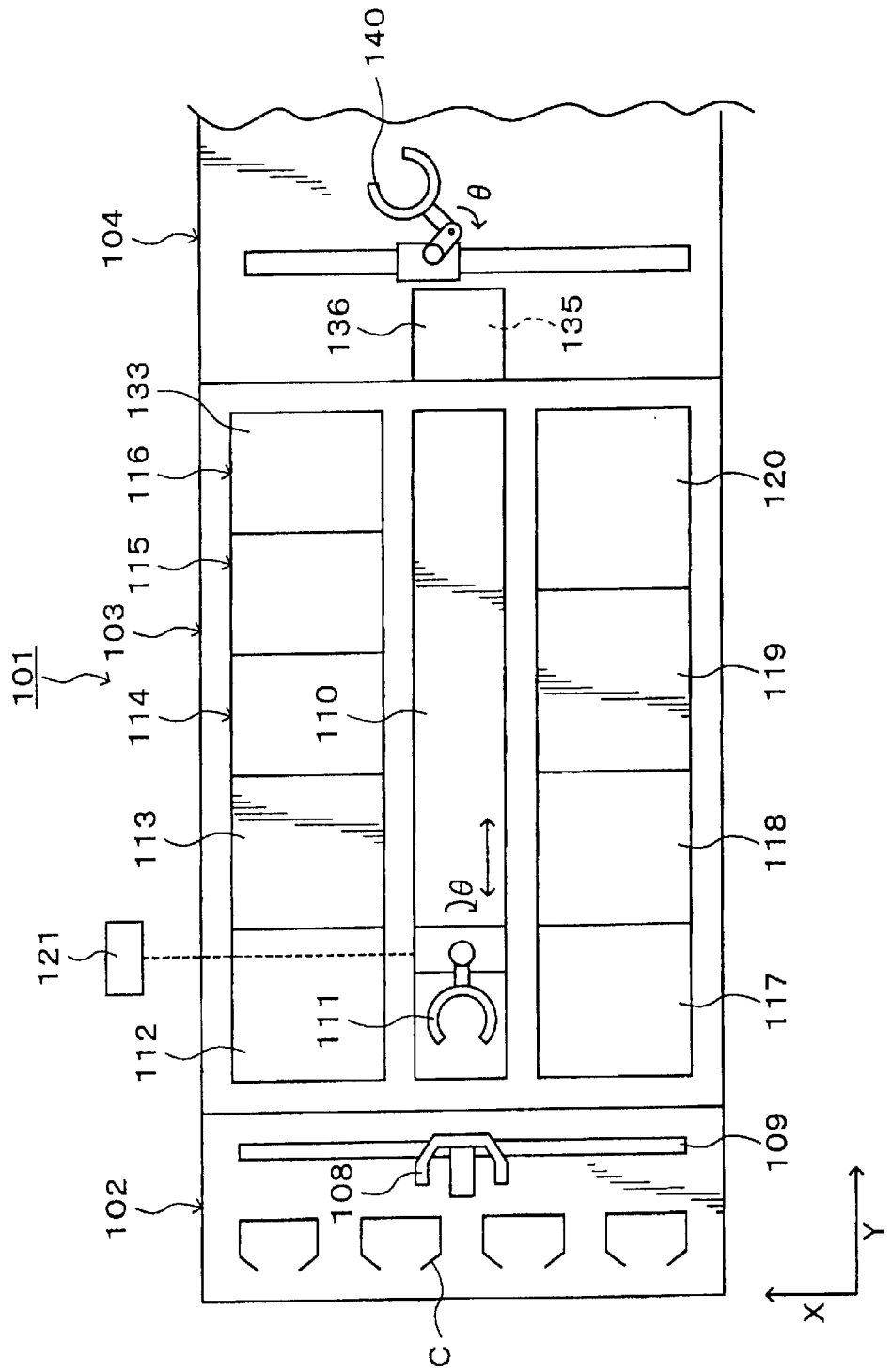
FIG. 8 is a plane view roughly showing the coating and developing treatment system in FIG. 7.

As shown in FIG. 7 and FIG. 8, the coating and developing treatment system 101 has a configuration in which a cassette station 102 for carrying, for example, a plurality of wafers W in a cassette, as a unit, from/to the outside into/out of the coating and developing treatment system 101 and carrying the wafer W into/out of a cassette C, a processing station 103 in which various kinds of processing and treatment units each for performing predetermined processing or treatment for the wafers W one by one in coating and developing treatment steps are arranged side by side in two rows in a Y-direction, and an interface section 104 for delivering the wafer W to/from an aligner not shown which is provided adjacent to the processing station 103, are integrally connected.

In the cassette station 102, a plurality of cassettes C can be mounted in a line in an X-direction. A wafer carrier 108 transportable in the direction of arrangement of the cassettes (the X-direction) and in the direction of arrangement of the wafers W housed in the cassette C (a Z-direction; a vertical direction) is provided to freely move along a carrier guide 109 to be able to selectively access each cassette C.

In the processing station 103, a carrier rail 110 extending in the Y-direction is provided at the center, on which a main carrier unit 111 is provided as a carrier unit freely moving on the carrier rail 110. Across the carrier rail 110, various kinds of processing and treatment units are arranged side by side on both sides in the Y-direction. More specifically, a brush scrubber 112 for cleaning the wafer W taken out of the cassette C, a wet cleaner 113 for performing high pressure jet cleaning for the wafer W, and treatment unit groups 114, 115 and 116 in each of which a plurality of thermal treatment units each for performing predetermined thermal treatment for the wafer W are multi-tiered, are arranged side by side, in order from the cassette station 102 side, on the front side of the carrier rail 110 in the X-direction. Meanwhile, resist coating units 117 and 118 each for applying a resist solution to the wafer W and developing treatment units 119 and 120 each for performing developing treatment for the exposure-processed wafer W are arranged side by side, in order from the cassette station 102 side, on the rear side of the carrier rail 110 in the X-direction.

The main carrier unit 111 is configured to freely move in a direction of rotation (a θ-direction) and in the Z-direction, as shown in FIG. 7 and FIG. 8, in addition to the above-described Y-direction so as to access the processing and treatment units in the processing station 103, the wafer carrier 108 in the cassette station 102, and extension units 135 and 136 as delivery units in the interface section 104 described below to carry the wafer W to them.

The main carrier unit 111 is configured to be controllable by a main controller 121 as a carrier controller as shown in FIG. 8, so that the main carrier unit 111 is controlled by the main controller 121 to carry the wafer W in accordance with a processing flow for the wafer W.

Figure 9:
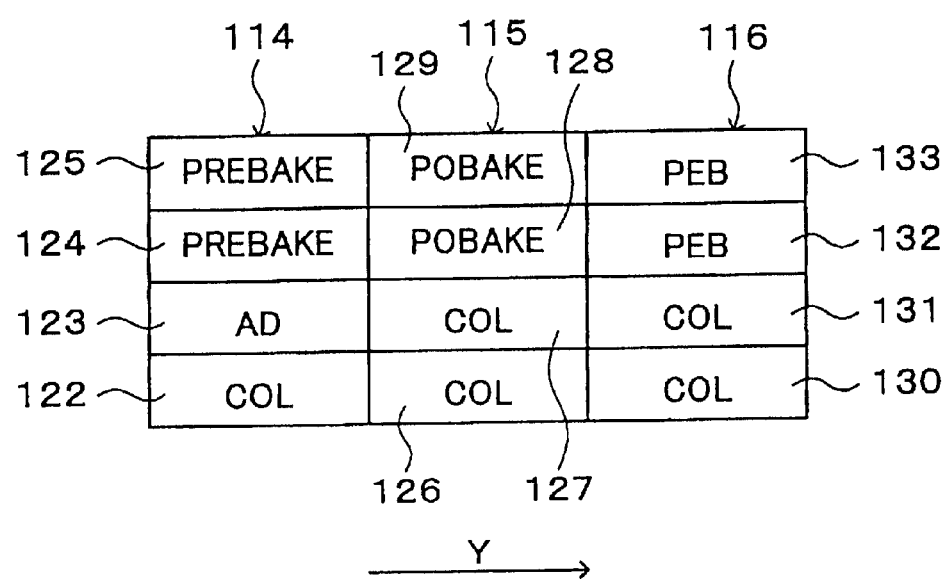
FIG. 9 is an explanatory view showing an arrangement example of processing and treatment units in processing unit groups of the coating and developing treatment system.

In the processing unit group 114, as shown in FIG. 9, for example, a cooling unit 122 for performing cooling treatment for the wafer W, an adhesion unit 123 for enhancing adhesion of the resist solution to the wafer W, pre-baking units 124 and 125 each for evaporating a solvent in the resist solution are tiered in order from the bottom. In the processing unit group 115, cooling units 126 and 127 and post-baking units 128 and 129 each for performing heat treatment for the developing-treated wafer W tiered in order from the bottom.

In the processing unit group 116, cooling units 130 and 131 and post-exposure baking units (hereinafter, referred to as "PEB units") 132 and 133 as heat treatment units each for performing heat treatment for the wafer W after exposure processing and before developing treatment, are tiered in order from the bottom. Casings of the PEB units 132 and 133 are provided with carrier openings 132a and 133a facing the carrier rail 110, as shown in FIG. 7, through which the wafer W is carried in/out. These carrier openings 132a and 133a are respectively provided with shutters 132b and 133b for preventing heat in the PEB units 132 and 133 from diffusing and adapted to open only when the wafer W is carried in/out.

Figure 10:
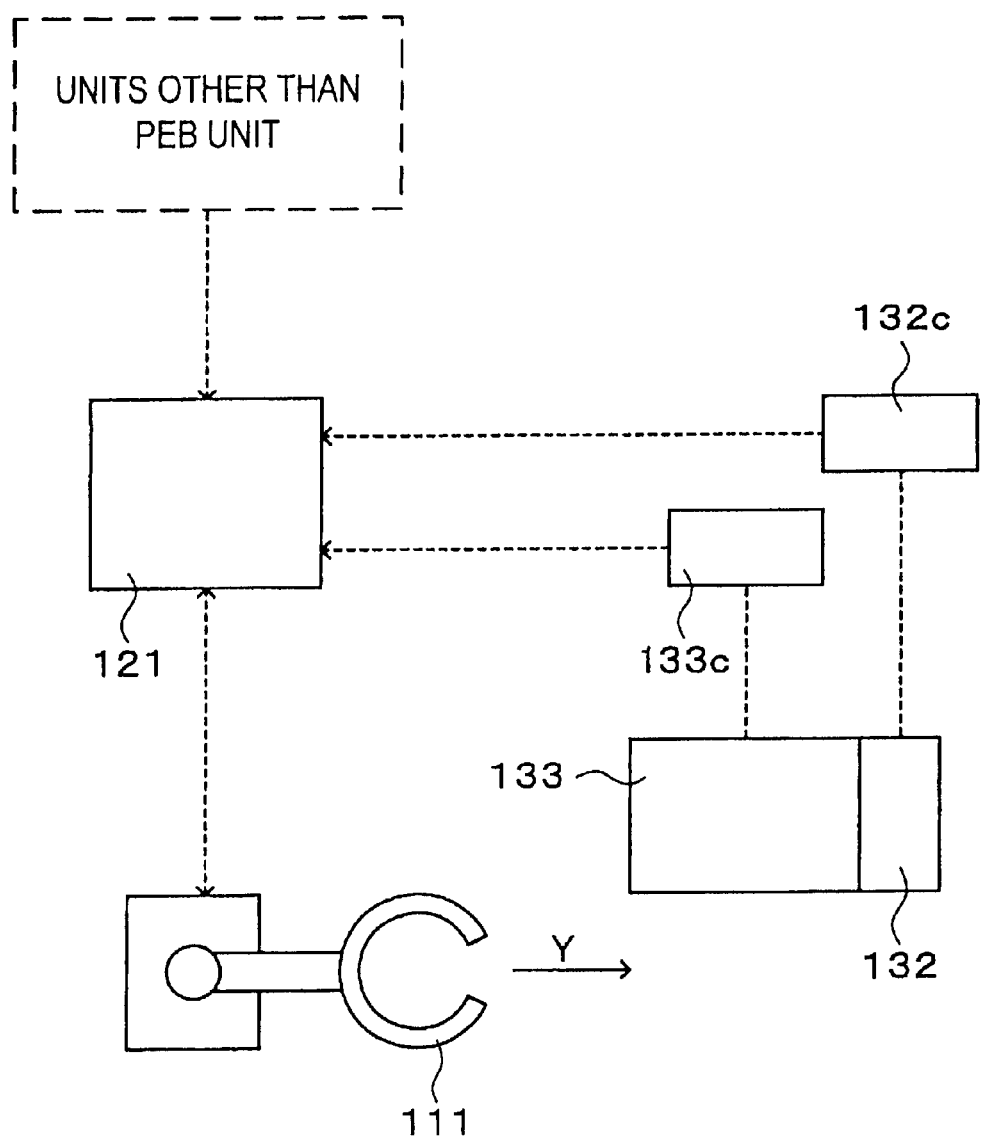
FIG. 10 is an explanatory view schematically showing the configuration of a control mechanism for controlling a main carrier unit.

In the PEB units 132 and 133 are provided with controllers 132c and 133c for controlling the operation of the PEB units 132 and 133 in the PEB treatment for the wafer W as shown in FIG. 10. Each of the controllers 132c and 133c is configured to be able to send a dummy end signal as an end notice signal for giving the main controller 121 notice of a predetermined period T before the completion of the PEB treatment. Note that the predetermined period T is previously set in the controllers 132c and 133c and may be changed.

The main controller 121 is configured to be able to receive the signals from the above-described controllers 132c and 133c of the PEB units 132 and 133 so as to receive the dummy end signals. The main controller 121 is configured to be able to send and receive the signal to/from the main carrier unit 111 to control it as described above, so that a controlling instruction can be sent and their states can be recognized each other by sending and receiving the signal. The main controller 121 is provided with a storage function for storing received data, in which the signal received by the main controller 121 can be stored when necessary.

The main controller 121 is configured to be able to send and receive signals also to/from the processing and treatment units other than the PEB units 132 and 133 in the processing station 103 so as to receive end signals of wafer processing sent from the processing and treatment units and store them by the aforesaid storing function. The main carrier unit 111 is configured to recognize and verify the wafer processing end signal stored in the main controller 121 and then move to the processing unit, the sender of the end signal, to carry the wafer W to the processing unit where the following processing is performed.

In the interface section 104, as shown in FIG. 7 and FIG. 8, a carrier 140 for carrying the wafer W between the processing station 103 and the aligner not shown is provided to freely move in the X-direction, the Z-direction, and in the θ-direction. The extension units 135 and 136 each for delivering the wafer W between the main carrier unit 111 and the carrier 140 are arranged tiered in order from the bottom on the processing station 103 side of the interface section 104 and on the extension line of the carrier rail 110. Each of the extension units 135 and 136 includes a mounting table not shown for mounting the wafer W thereon and raising and lowering pins not shown for raising and lowering the wafer W The extension unit 135 is used when the wafer W is carried from the main carrier unit 111 to the carrier 140, and the extension unit 136 is used when the wafer W is carried from the carrier 140 to the main carrier unit 111.

Next, the method of carrying the wafer W which is carried out in the coating and developing treatment system 101 structured as described above is explained with the process of the photolithography processing steps.

Initially, in the cassette station 102, the wafer carrier 108 takes one unprocessed wafer W out of the cassette C, and then the main carrier unit 111 receives the wafer W direct from the wafer carrier 108. Subsequently, the main carrier unit 111 carries the wafer W in sequence to the brush scrubber 112 and the wet cleaner 113, and further in sequence to the adhesion unit 123 and the cooling unit 122 which are included in the processing unit group 114, whereby the wafer W is subjected to predetermined processing in the processing and treatment units. Then the wafer W is carried by the main carrier unit 111 to the resist coating unit 117 or 118 to be coated thereon with a chemically amplified resist solution, whereby a resist film is formed on the wafer W. The wafer W on which the resist film formed is then carried again by the main carrier unit 111 in sequence to the pre-baking unit 124 or 125 and the cooling unit 126 to be subjected to predetermined processing there.

The wafer W which has been cooled to a predetermined temperature in the cooling unit 126 or 127 is carried by the main carrier unit 111 into the extension unit 135 of the interface section 104 and mounted on the mounting table not shown. Subsequently, the wafer W is carried by the carrier 140 to the aligner not shown, where a predetermined pattern is exposed on the wafer W. In this event, acid, which acts as a catalyst for solubilization reaction of the resist film in the developing solution, generates in the resist film in the exposed portion. The wafer W for which exposure processing has been completed is carried again by the main carrier 140 to the extension unit 136, and then carried by the main carrier unit 111 into the PEB unit 133 through the carrier opening 133a of the PEB unit 133.

Figure 11:
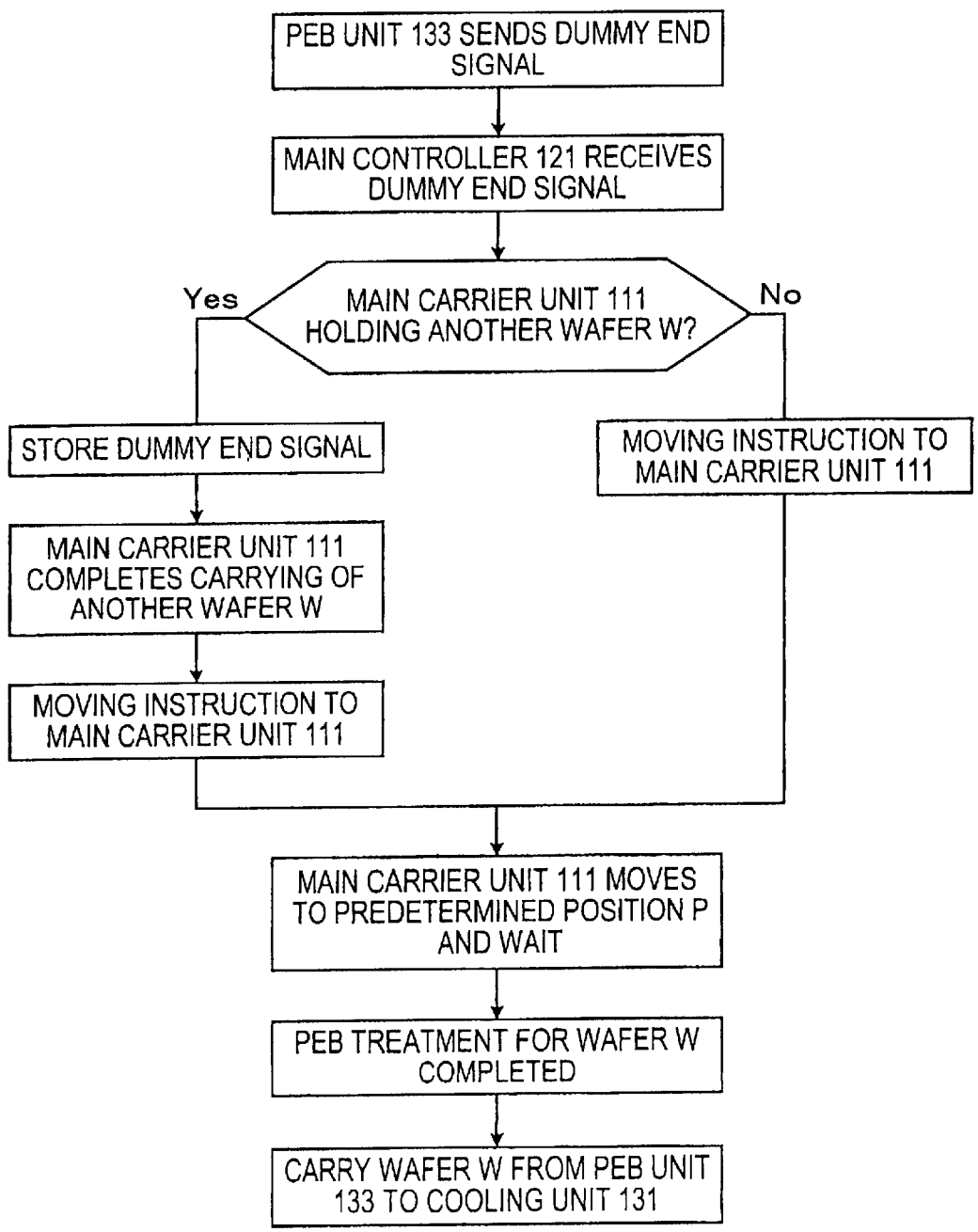
FIG. 11 shows a flowchart of wafer processing in relation to the main carrier unit.

The following wafer processing is explained along the flow chart in FIG. 11. The wafer W is initially heated at a predetermine temperature in the PEB unit 133, whereby the acid in the resist film is activated to proceed the solubilization reaction of the resist film in the exposed part to the developing solution. Then, when it is a predetermined period T before the completion of the heat treatment, the controller 133c sends a dummy end signal of giving notice that it is immediately before the completion of the heat treatment, to the main controller 121.

Figure 12:
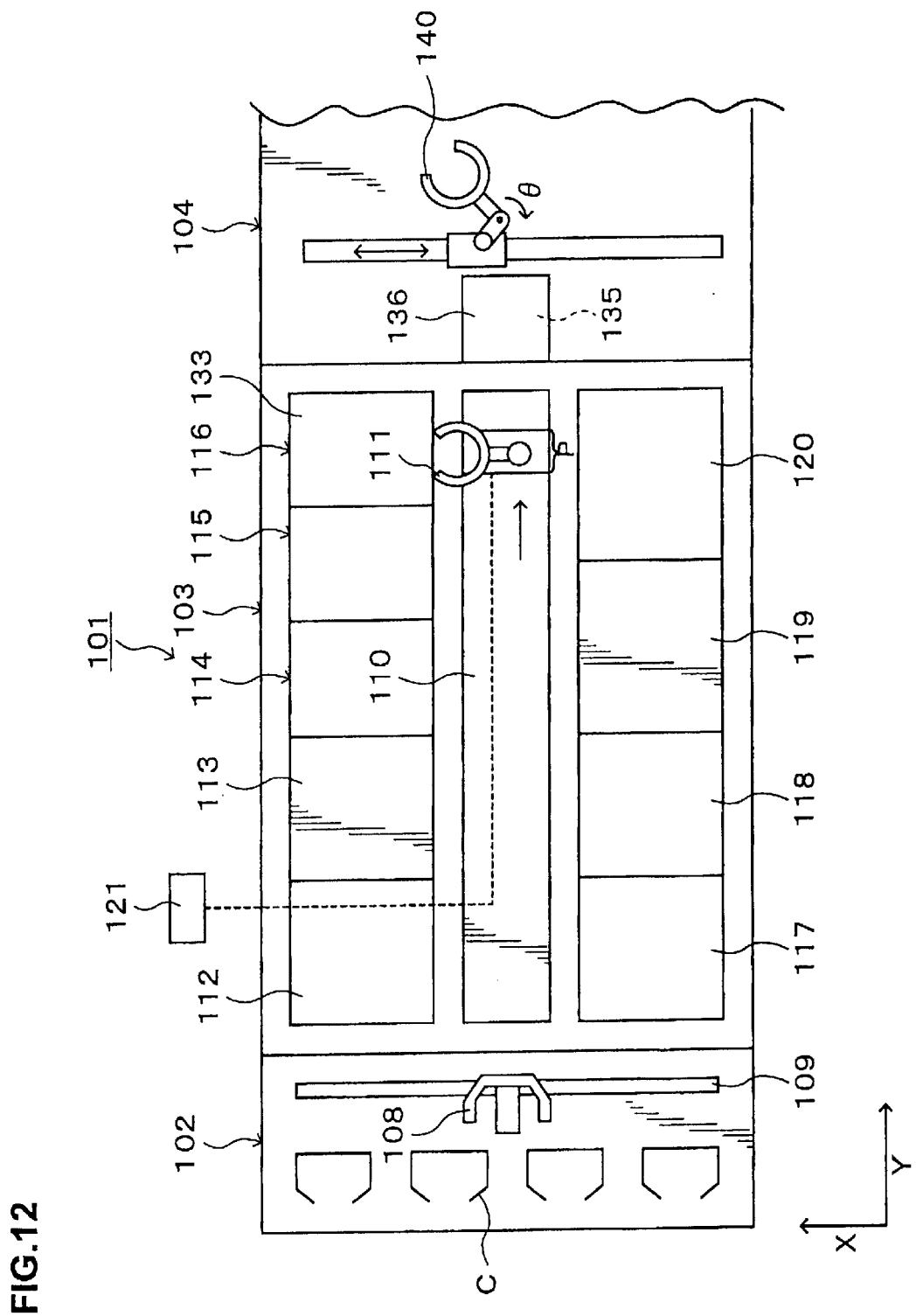
FIG. 12 is a state view of the coating and developing treatment system showing a state in which the main carrier unit is waiting at a predetermined position.

The main controller 121 which has received the aforesaid dummy end signal immediately verifies whether or not the main carrier unit 111 is keeping another wafer W. When the main carrier unit 111 is not keeping another wafer W, the main controller 121 instructs the main carrier unit 111 to move to the predetermined position P where it can receive the wafer W in the PEB unit 133, that is, a position in front of the shutter 133b of the PEB unit 133. The main carrier unit 111 which has received the instruction moves on the carrier rail 110 to the predetermined position P as shown in FIG. 12 and waits there until the shutter 133b at the carrier opening 133a is opened.

Meanwhile, when the main carrier unit 111 is keeping another wafer W, the main controller 121 stores therein the dummy end signal and always verifies whether or not the main carrier unit 111 is keeping the other wafer W, and gives a moving instruction to the main carrier unit 111 to move to the predetermined position P when the main carrier unit 111 completes the carrying operation of the other wafer W and becomes a so-called free state.

Thereafter, when the heat treatment in the PEB unit 133 is completed and the shutter 133b is opened, the waiting main carrier unit 111 immediately carries the wafer W out of the PEB unit 133 to the cooling unit 131.

The wafer W which has been carried to the cooling unit 131 is cooled to a predetermined temperature, whereby the catalysis of the acid then stops.

Thereafter, the wafer W is carried by the main carrier unit 111 to the developing treatment unit 119 or 120 to be subjected to developing treatment. The wafer W for which the developing treatment has been completed is carried again by the main carrier unit 111 in sequence to post-baking unit 128 or 129 and the cooling unit 127. The wafer W for which the cooling treatment has been completed is carried backward in the Y-direction on the carrier rail 110 and delivered to the wafer carrier 108 in the cassette station 102. The wafer W is returned to the cassette C by the wafer carrier 108, and a series of photolithography processing steps is thus completed.

In the above-described second embodiment, the PEB unit 133 previously sends the dummy end signal to the main controller 121, and the main carrier unit 111 moves by the instruction from the main controller 121, which has received the dummy end signal, to the predetermined position P in front of the PEB unit 133 and waits there until the PEB treatment is completed, so that the main carrier unit 111 can receive the wafer W immediately after the PEB treatment for the wafer W is completed and the shutter 133 is opened, and carry it to the cooling unit 131. This avoids the wafer W, for which the PEB treatment has completed, from being waiting in the PEB unit 133 for the main carrier unit 111 to come to receive it, whereby the period required from the PEB treatment to the cooling treatment is reduced and kept fixed.

Further, before the main controller 121 which has received the dummy end signal gives a moving instruction to the main carrier unit 111, the main controller 121 verifies whether or not the main carrier unit 111 is carrying another wafer W, and when it is carrying, the main controller 121 gives the moving instruction immediately after the completion of the carrying, thereby making it possible to properly cope with the case where the main carrier unit 111 can not move to the predetermined position P because of the carrying of the other wafer W. Furthermore, as compared with the conventional case in which after the PEB treatment for the wafer W is completed, the end signal is sent to the main controller 121, and thereafter the main carrier unit 111 verifies the end signal and then moves to the predetermined position P, the main carrier unit 111 can move earlier to the predetermined position P where it can receive the wafer W, and thus the period required from the PEB treatment to the cooling treatment is reduced and kept fixed also in this case.

The above-described embodiment is the case in which the main carrier unit 111 has moved to the predetermine position P where it can access the PEB unit 133 without fail before the completion of the PEB treatment. However, it is predictable that it takes a long time for the main carrier unit 111 to carry another wafer W to be late for the time at the completion of the PEB treatment. As measures in this case, it is suggested that the overbaked wafer W is separated from the properly processed wafers W.

Figure 13:
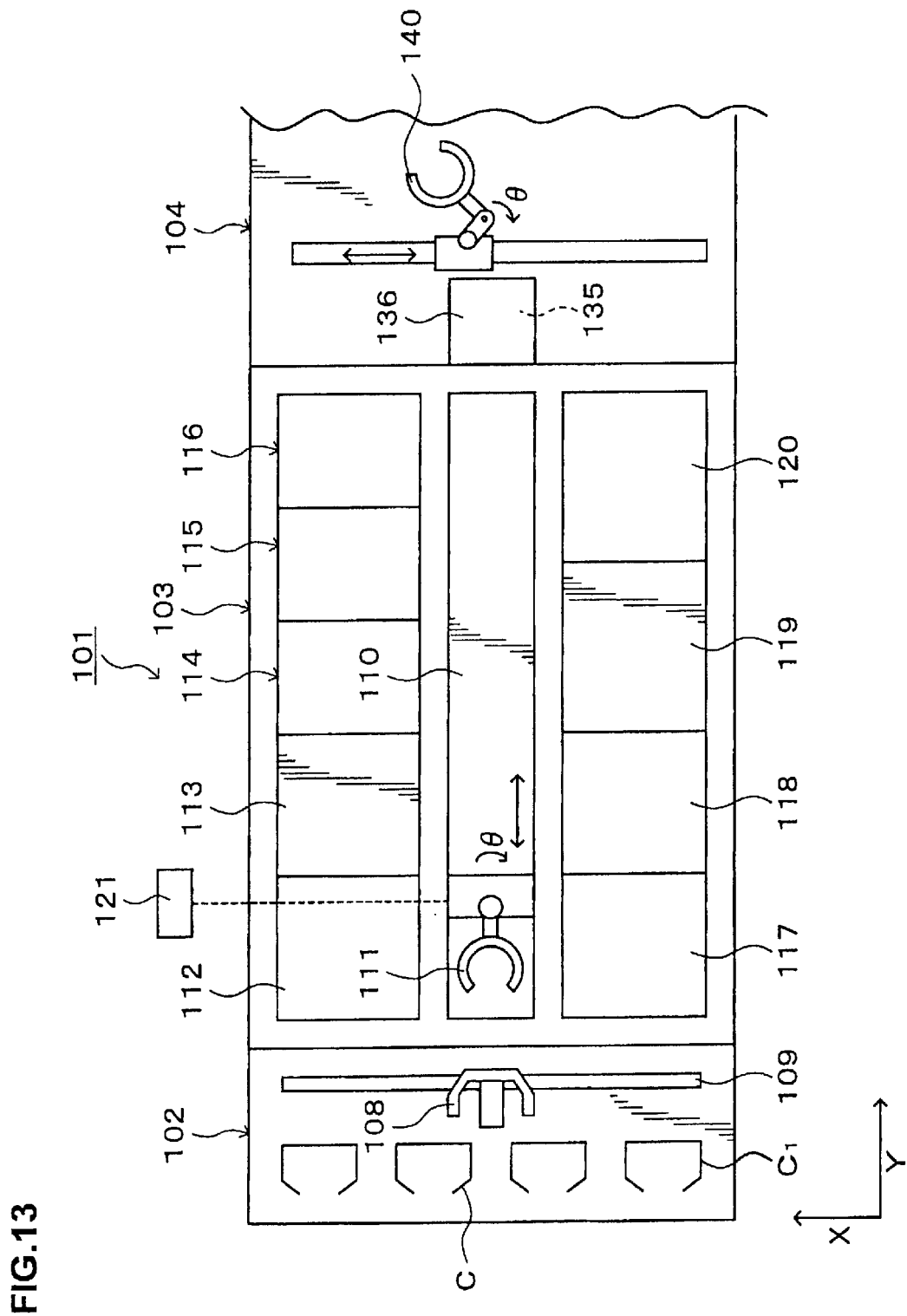
FIG. 13 is a plane view roughly showing the coating and developing treatment system when a cassette for needing caution in a cassette station.

For example, imaginary numbers are previously given as discrimination marks to the wafers W, and previously recognized by, for example, the main controller 121. When the main carrier unit 111 is late for the time at the completion of the PEB treatment, the main controller 121 recognizes the number of the wafer under processing at that time as a wafer needing caution. Thereafter, the wafer needing caution is processed in accordance with the predetermined processing flow, and when it is carried to the cassette C in the cassette station 102, it is separated and mounted, for example, in a cassette C1 which is previously provided for a wafer needing caution as shown in FIG. 13. This makes it possible to separate the overbaked wafer W and the normally PEB-processed wafers W, thereby removing a wafer W of a poor quality from products.

Alternatively, the wafer W overbaked in the PEB unit 133 may be carried, not subjected to the following processing, immediately to the cassette station 102 to be carried into the cassette C1 for the wafer W needing caution. In this case, the developing treatment and the like are not performed yet, making it possible to use again the wafer W by removing the resist film thereon.

Note that the predetermined period T of the controller 133c is preferably set to be somewhat long enough to prevent the main carrier unit 111 from not usually being late for the completion of the PEB treatment.

The method of carrying the wafer W according to the above-described embodiment is for the carrying from the PEB unit 133 to the cooling unit 131, and it is also applicable to the carrying between another heat treatment unit and cooling treatment unit, for example, between the pre-baking unit 124 or 125 and the cooling unit 126, and between the post-baking unit 128 or 129 and the cooling unit 127.

Furthermore, the above-described embodiment is for the method of carrying the wafer W in the photolithography process in the semiconductor wafer device fabrication processes, and the present invention is applicable to a method of carrying a substrate other than the semiconductor wafer, for example, an LCD substrate.

According to the present invention, the carrier unit for the substrate keeps waiting from before the completion of the heat treatment for the substrate at the position where it can receive the substrate in the heat treatment unit in which the heat treatment is performing, to immediately carry the substrate, for which the heat treatment has been completed, to the cooling treatment unit, whereby the period required from the heat treatment to the cooling treatment is reduced and kept fixed. Consequently, overbaking or difference in thermal history between substrates is reduced to form a predetermined pattern on the substrate, resulting in improved yields.

What is claimed is:

1. A coating and development treatment apparatus for performing coating and development treatments for a substrate, comprising:
　　a processing station including a plurality of treatment units each configured to perform a predetermined treatment for the substrate;
　　an interface section provided between the processing station and an aligner;
　　a first carrier provided in the interface section and configured to carry the substrate, which has been exposure-processed, to a delivery unit in the interface section;
　　a second carrier provided in the processing station and configured to carry the substrate to the plurality of treatment units including a heat treatment unit where heat treatment before developing treatment is performed and to the delivery unit; and a controller configured to control the first carrier and the second carrier, wherein the controller conducts a control so that at least when the exposure processing for the substrate is completed, the first carrier is waiting at the first position where the first carrier is configured to receive the exposed substrate to immediately carry the substrate, for which the exposure processing has been completed, to the delivery unit, and further at least when the exposure-processed substrate is carried to the delivery unit, the second carrier is waiting at a second position where the second carrier is configured to receive the substrate staying in the delivery unit to carry the substrate to the heat treatment unit immediately after the exposure-processed substrate is carried to the delivery unit, and the controller controls the second carrier unit such that when the second carrier is not waiting, the second carrier carries other substrates existing in the processing station to the plurality of processing and treatment units.

2. The coating and developing treatment apparatus as set forth in claim 1, wherein the controller controls the first carrier such that when a predetermined period T is required for the exposure processing for the substrate, even if the predetermined period T elapses before the completion of the exposure processing, the first carrier is waiting until after a lapse of a period not longer than a maximum waiting period I which is longer than the predetermined period T, measured from the start of the exposure processing.

3. The coating and developing treatment apparatus as set forth in claim 1, wherein the controller controls the second carrier such that when a predetermined period T is required for the exposure processing for the substrate, even if the predetermined period T elapses before the completion of the exposure processing, the second carrier is waiting until after a lapse of a period not longer than a maximum waiting period M which is longer than the predetermined period T, measured from the start of the exposure processing.

4. A coating and development treatment apparatus for performing coating and development treatments for a substrate, comprising:

a processing station including a plurality of treatment units each configured to perform predetermined treatment for the substrate;

an interface section provided between the processing station and an aligner;

a first carrier movable on a rail provided in the interface section and configured to carry the substrate, which has been exposure-processed, to a delivery unit in the interface section;

a second carrier movable on a carrier rail provided in the processing section and configured to carry the substrate to the plurality of treatment units including a heat treatment unit where heat treatment before developing treatment is performed and to the delivery unit, and a controller configured to control the first carrier and the second carrier, wherein the controller controls the first carrier and the second carrier such that at least when the exposure processing for the substrate is completed, the first carrier is waiting at a first position on the rail where the first carrier is configured to receive the substrate to carry the substrate to the delivery unit immediately after the exposure processing for the substrate is completed, and at least when the substrate is carried to the delivery unit, the second carrier is waiting at a second position on the carrier rail where the second carrier is configured to receive the substrate to carry the substrate to the heat treatment unit immediately after the substrate is carried to the delivery unit.

5. The coating and developing treatment apparatus as set forth in claim 4, wherein the controller controls the first carrier such that when a predetermined period T is required for exposure processing for the substrate, even if the predetermined period T elapses before the completion of the exposure processing, the first carrier is waiting at the first position until after a lapse of a period not longer than a maximum waiting period I which is longer than the predetermined period T, measured from the start of the exposure processing.

6. The coating and developing treatment apparatus as set forth in claim 4, wherein the controller controls the second carrier such that when a predetermined period T is required for the exposure processing for the substrate, even if the predetermined period T elapses before the completion of the exposure processing, the second carrier is waiting at the second position until after a lapse of a period not longer than a maximum waiting period M which is longer than the predetermined period T, measured from the start of the exposure processing.

7. A coating and development treatment apparatus for performing coating and development treatments for a substrate, comprising:

a processing station including a plurality of treatment units each configured to perform predetermined treatment for the substrate;

an interface section provided between the processing station and an aligner;

a first carrier movable on a rail provided in the interface section and configured to carry the substrate, which has been exposure-processed, to a delivery unit in the interface section, a second carrier movable on a carrier rail provided in the processing section and configured to carry the substrate to the plurality of treatment units including a heat treatment unit where heat treatment before developing treatment is performed and to the delivery unit; and a controller configured to control the first carrier and the second carrier, wherein the controller controls the first carrier such that at least when the exposure processing for the substrate is completed, the first carrier is waiting at a first position on the rail where the first carrier is configured to receive the substrate to carry the substrate to the delivery unit immediately after the exposure processing for the substrate is completed.

8. The coating and developing treatment apparatus as set forth in claim 7, wherein the controller controls the first carrier such that when a predetermined period T is required for the exposure processing for the substrate, even if the predetermined period T elapses before the completion of the exposure processing, the first carrier is waiting until after a lapse of a period not longer than a maximum waiting period I which is longer than a predetermined period T, measured from the start of the exposure processing.

9. A coating and developing treatment apparatus for performing coating and developing treatments for a substrate, comprising:

a processing station including a plurality of treatment units each configured to perform predetermined treatment for the substrate;

an interface section provided between the processing station and an aligner;

a first carrier movable on a rail provided in the interface section and configured to carry the substrate which has been exposure processed, to an delivery unit in the interface section;

a second carrier movable on a carrier rail provided in the processing station and configured to carry the substrate to the plurality of treatment units including a heat treatment unit where heat treatment before developing treatment is performed and to the delivery unit; and a controller configured to control the first carrier and the second carrier, wherein the controller controls the second carrier such that at least when the substrate is carried to the delivery unit, the second carrier is waiting at a predetermined position on the carrier rail where the second carrier is configured to receive the substrate to carry the substrate to the heat treatment unit immediately after the substrate is carried to the delivery unit.

10. The coating and developing treatment apparatus as set forth in claim 9, wherein the controller controls the second carrier such that when a predetermined period T is required for the exposure processing for the substrate, even if the predetermined period T, elapses before the completion of the exposure processing, the second carrier is waiting until after a lapse of a period not longer than a maximum waiting period M which is longer than a predetermined period T, measured from the start of the exposure processing.

* * * * *